United States Patent [19]

Burton et al.

[11] Patent Number: 5,667,632
[45] Date of Patent: Sep. 16, 1997

[54] METHOD OF DEFINING A LINE WIDTH

[75] Inventors: Richard S. Burton, Tempe; Gordon M. Grivna, Mesa, both of Ariz.

[73] Assignee: Motorola, Inc., Schaumburg, Ill.

[21] Appl. No.: 556,688

[22] Filed: Nov. 13, 1995

[51] Int. Cl.$^6$ ............... H01L 21/00; B44C 1/22
[52] U.S. Cl. ............. 438/570; 216/39; 216/41; 438/572; 438/582; 438/585; 438/590; 438/692; 438/699
[58] Field of Search ............... 156/636.1, 643.1, 156/648.1, 653.1, 656.1, 657.1, 659.11, 662.1, 644.1; 216/2, 18, 39, 41; 437/233, 228, 238, 241, 245

[56] References Cited

U.S. PATENT DOCUMENTS

| | | | |
|---|---|---|---|
| 4,358,340 | 11/1982 | Fu | 156/657.1 X |
| 4,502,914 | 3/1985 | Trumpp et al. | 156/657.1 X |
| 4,572,765 | 2/1986 | Berry | 156/657.1 X |
| 4,648,937 | 3/1987 | Ogura et al. | 156/657.1 X |
| 4,776,922 | 10/1988 | Bhattacharyya et al. | |
| 4,803,181 | 2/1989 | Buchmann et al. | 216/49 |
| 5,115,288 | 5/1992 | Manley | |
| 5,192,702 | 3/1993 | Tseng | |
| 5,281,839 | 1/1994 | Cambou et al. | |
| 5,384,273 | 1/1995 | Davies et al. | |

OTHER PUBLICATIONS

Tohru Nishibe, J. Vac Sci. Technol.B 13(4), "Novel fabrication process utilizing thermal stress for uniform ultrafine SiO$_2$ gaps with perfectly vertical sidewalls", Jul./Aug. 1995, pp. 1429–1433.

*Primary Examiner*—William Powell
*Attorney, Agent, or Firm*—George C. Chen

[57] ABSTRACT

A method of defining a line width includes forming a spacer (45) over a layer (42) and using the spacer (45) as an etch mask (57) while etching the layer (42). In this manner, a width (47) of the spacer (45) is used to define a width or line width (47) for the layer (42). Another method of using a spacer to define a line width includes forming a spacer (14) over a substrate (11), depositing a layer (15) over the substrate (11) and the spacer (14), planarizing the layer (15) to expose the spacer (14), and removing the spacer (14) to form an opening (19) over the substrate (11), wherein the opening (19) has a width or line width (17) of the spacer (14).

23 Claims, 4 Drawing Sheets

METHOD OF DEFINING A LINE WIDTH

BACKGROUND OF THE INVENTION

This invention relates, in general, to a method of fabricating a semiconductor component, and more particularly, to a method of defining a line width.

With the ever increasing demand for smaller and more compact semiconductor components, designers are shrinking the size of gate lengths, line widths, and the like. However, it is difficult to manufacture a precise line width for submicron geometries because conventional photolithographic techniques are not sufficient. Alternative methods for forming a submicron line width include using phase shifting technology, electron beam lithography, ion beam lithography, and X-ray lithography. While phase shifting technology can define 0.35 micron line widths, it is also expensive and complicated. Electron beam lithography, ion beam lithography, and X-ray lithography are capable of defining 0.1 micron line widths, but these non-standard techniques are even more expensive and complicated than phase shifting technology.

Another existing method for defining small line widths includes etching an opening having a larger line width and forming spacers along sidewalls of the opening to reduce the size of the opening and to reduce the size of the final line width. However, this technique is still limited by the photolithographic capability that defines the original opening.

Accordingly, a need exists for a low cost method of defining a line width, especially when the line width is less than one micron. The method should be manufacturable and should not significantly increase the cycle time of manufacturing a semiconductor component.

DETAILED DESCRIPTION OF THE DRAWINGS

Figure 1:
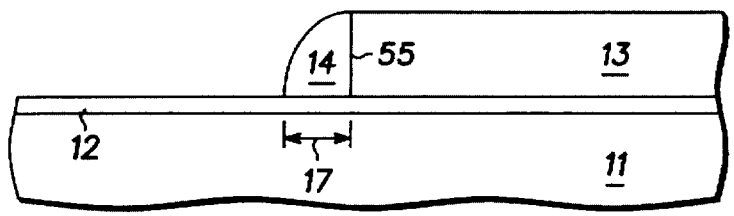
FIGS. 1–5 illustrate cross-sectional views of a method of defining a line width in accordance with the present invention.

Turning to the figures for a detailed description, FIGS. 1–5 illustrate cross-sectional views of a method of defining a line width in accordance with the present invention. In particular, FIG. 1 depicts a portion of a semiconductor device or a semiconductor component 10 having a substrate 11. While substrate 11 can comprise a myriad of suitable materials over which or in which a submicron feature is formed, substrate 11 preferably comprises a semiconductor material such as, for example, single crystal silicon or gallium arsenide. Accordingly, substrate 11 is hereinafter referred to as semiconductor substrate 11. Although not depicted in FIG. 1, semiconductor substrate 11 can support a plurality of semiconductor devices or components, which are coupled together to form an integrated circuit. Preferably, semiconductor component 10 is a gallium arsenide metal-semiconductor field effect transistor (MESFET).

In a preferred embodiment, an etch stop layer 12 is provided over semiconductor substrate 11. Although etch stop layer 12 is not required, etch stop layer 12 helps to protect semiconductor substrate 11 during the formation of a spacer 14 as described below. Etch stop layer 12 preferably comprises aluminum nitride. However, other suitable etch stop materials can also be used for etch stop layer 12. In a preferred embodiment, the aluminum nitride of etch stop layer 12 is deposited at room temperature by sputtering an aluminum target in a nitrogen ambient.

As portrayed in FIG. 1, a temporary structure 13 is formed over etch stop layer 12 and semiconductor substrate 11. Temporary structure 13 comprises a dielectric material including, but not limited to, nitride or oxide. In a preferred embodiment, temporary structure 13 comprises silicon oxide. As an example of how temporary structure 13 is formed, a silicon oxide layer is deposited over etch stop layer 12 in a plasma enhanced chemical vapor deposition (PECVD) process using a reaction of silane and oxygen gases at a temperature between approximately 200° and 500° degrees Celsius (°C.). Subsequently, a patterned photoresist layer (not shown) is used as an etch mask while creating or etching an edge 55 of temporary structure 13 out of the deposited silicon oxide layer. While an anisotropic or isotropic etch can be used, temporary structure 13 is preferably etched in a reactive ion etch (RIE) chamber using a fluorine based plasma. Temporary structure 13 does not need to have submicron geometries, and therefore, its formation is not limited to using expensive submicron patterning techniques.

Spacer 14 is subsequently formed along or adjacent to edge 55 of temporary structure 13 by first disposing a dielectric layer over temporary structure 13 and etch stop layer 12 and then etching the dielectric layer. No photoresist pattern is required to form spacer 14. The dielectric layer of spacer 14 can be comprised of, for example, silicon oxide but is preferably comprised of silicon nitride. In a preferred embodiment, the silicon nitride is conformally deposited in a PECVD process using a reaction of silane and ammonia at 200°–500° C. and is anisotropically etched in a RIE process using a fluorine based plasma.

The position of edge 55 defines the location of spacer 14. Because spacer 14 is used to define the position of a gate electrode as described below and because the position of a gate electrode is an important consideration for a semiconductor transistor, the position of edge 55 of temporary structure 13 should be precisely located. Accordingly, an anisotropic etch is preferably used to etch edge 55 of temporary structure 13 as described above.

Spacer 14 has a width 17 as indicated in FIG. 1. Width 17 is mainly determined by three factors: the height of temporary structure 13, the thickness of the silicon nitride that is deposited to form spacer 14, and the amount of silicon nitride that is etched away to form spacer 14. While these three factors may be changed independently of one another, the formation of a taller temporary structure 13, the deposition of a thicker silicon nitride, or the etching away of less silicon nitride can produce a larger width 17 for spacer 14. Similarly, the formation of a shorter temporary structure 13, the deposition of a thinner silicon nitride layer, or the etching away of more silicon nitride can produce a smaller width 17 for spacer 14. Accordingly, width 17 can be as large as a few microns and can also be in the submicron range.

Figure 2:
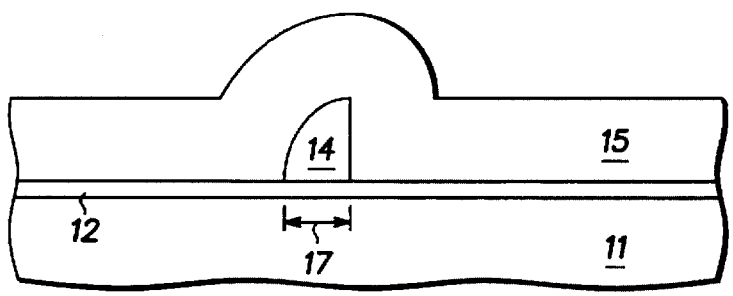

Continuing with FIG. 2, another partial cross-sectional view of semiconductor component 10 illustrates a removal of temporary structure 13 and a deposition of an electrically insulating layer 15 over spacer 14, etch stop layer 12, and semiconductor substrate 11. Temporary structure 13 is removed using an etch process that does not substantially etch spacer 14. In a preferred embodiment, where temporary structure 13 comprises silicon oxide and where spacer 14 comprises silicon nitride, a hydrofluoric (HF) acid is used to selectively remove temporary structure 13 while leaving spacer 14 over etch stop layer 12. Alternatively, when temporary structure 13 comprises silicon nitride and when spacer 14 comprises silicon oxide, a fluorine based plasma which selectively etches silicon nitride versus silicon oxide can also be used to remove temporary structure 13. In another alternative embodiment, temporary structure 13 is not removed at this step of the process, and electrically insulating layer 15 is deposited over temporary structure 13.

Electrically insulating layer 15 preferably comprises a dielectric layer including, but not limited, to aluminum nitride, silicon nitride, or silicon oxide and is herein referred to as dielectric layer 15. The composition of dielectric layer 15 should be different from that of spacer 14 such that spacer 14 can be selectively etched over dielectric layer 15. Accordingly, when spacer 14 comprises silicon nitride, dielectric layer 15 preferably comprises silicon oxide and can be disposed over semiconductor substrate 11 in a technique similar to that of the previously described preferred embodiment of temporary structure 13 in FIG. 1.

Figure 3:
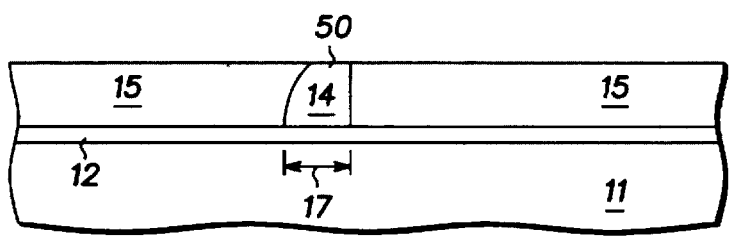

Referring now to FIG. 3, a partial cross-sectional view of semiconductor component 10 illustrates dielectric layer 15 after being planarized to expose a portion of spacer 14. In a preferred embodiment, a chemical-mechanical polish is used to planarize dielectric layer 15 and removes a portion of spacer 14 as depicted in FIG. 3. However, other planarizing techniques known in the art can also be used to planarize dielectric layer 15. These techniques include, but are not limited to, a resist etch back process. Alternatively, a patterned photoresist process can be used along with an etch process to expose a portion of spacer 14.

Figure 4:
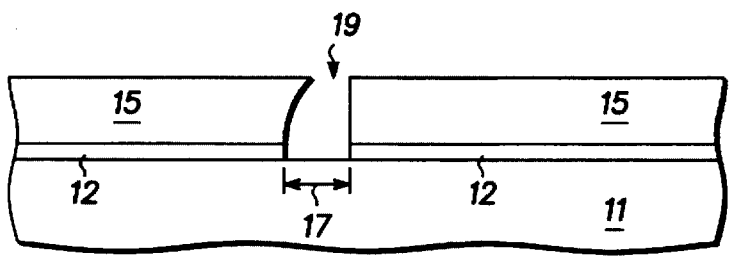

Next, spacer 14 is removed as illustrated in FIG. 4. Spacer 14 is etched away without substantially etching dielectric layer 15 such that opening 19 has a width substantially equal to width 17 of spacer 14. Spacer 14 can be etched by an isotropic or anisotropic etchant but is preferably etched in an RIE chamber having a fluorine based plasma. Because spacer 14 is not a permanent part of semiconductor component 10, spacer 14 is also referred to as temporary structure 50.

Etch stop layer 12 prevents the echant, which removes spacer 14, from etching or damaging semiconductor substrate 11 located beneath spacer 14. After the removal of spacer 14, the exposed portion of etch stop layer 12 in opening 19 is also removed as portrayed in FIG. 4. When etch stop layer 12 is aluminum nitride, etch stop layer 12 is preferably etched with ammonium hydroxide (NH$_4$OH) or phosphoric acid. If spacer 14 and temporary structure 13 can be etched without damaging semiconductor substrate 11, etch stop layer 12 is not required in accordance with the present invention.

In an alternative embodiment, etch stop layer 12 is a dielectric layer that is not removed from opening 19. In this alternative embodiment, etch stop layer 12 is used as a gate insulator in an insulated gate field effect transistor such as, for example, a metal-oxide field effect transistor (MOSFET).

Figure 5:
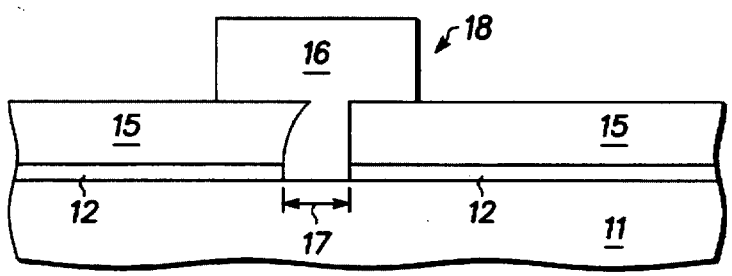

Continuing with FIG. 5, an electrically conductive layer 16 is disposed over dielectric layer 15 and is disposed in opening 19. Where semiconductor substrate comprises gallium arsenide, electrically conductive layer 16 is preferably comprised of a refractory metal such as, for example, tungsten nitride, titanium tungsten nitride, or the like. Electrically conductive layer 16 is used to form a gate electrode 18 and is herein referred to as gate layer 16. Gate layer 16 is preferably etched in a RIE etch using a fluorine based plasma to form gate electrode 18. Gate electrode 18 has a gate length substantially equal to width 17 of spacer 14. Width 17, hereinafter referred to as gate length 17, is preferably less than 1.0 micron but can, in the alternative, be greater than 1.0 micron.

Figure 6:
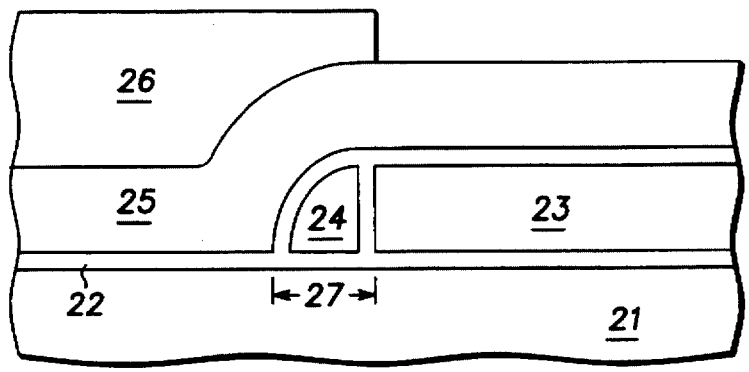
FIGS. 6–7 portray cross-sectional views of an alternative method of defining a line width in accordance with the present invention.
Figure 7:
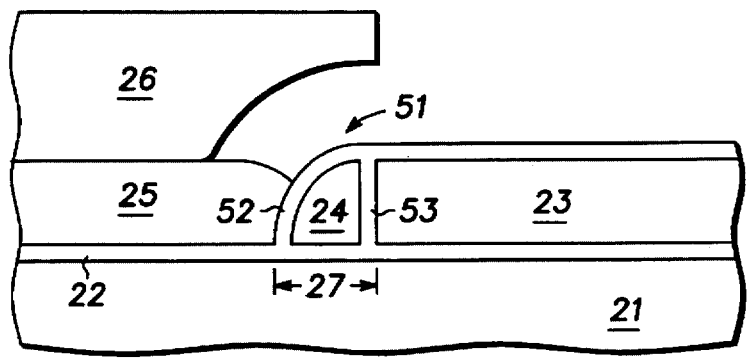

FIGS. 6 and 7 portray cross-sectional views of an alternative method of defining a line width in accordance with the present invention. A partial view of a semiconductor component 20 in FIG. 6 depicts a substrate 21 supporting an etch stop layer 22, a temporary structure 23, a spacer 24, a dielectric layer 25, and a patterned photoresist layer 26. FIG. 6 can be compared to FIG. 2, which was described earlier. Accordingly, semiconductor component 20 of FIG. 6 is similar to semiconductor component 10 of FIG. 2. Likewise, substrate 21, etch stop layer 22, temporary structure 23, spacer 24, and dielectric layer 25 of FIG. 6 are similar to semiconductor substrate 11, etch stop layer 12, temporary structure 13, spacer 14, and dielectric layer 15, respectively, of FIG. 2.

Etch stop layer 22 of FIG. 6 is deposited in several stages. First, a layer of etch stop material is deposited prior to the formation of temporary structure 23 such that it is located between temporary structure 23 and substrate 21. After the formation of temporary structure 23, another layer of the etch stop material is deposited over temporary structure 23. Then, following the formation of spacer 24, the deposition of etch stop layer 22 is completed after a third layer of the etch stop material is deposited over spacer 24.

Patterned photoresist layer 26 is used to mask a portion of dielectric layer 25 during a planarization process as portrayed in FIG. 7. In the illustrated embodiment, patterned photoresist layer 26 is a reverse image of the photoresist layer used to form temporary structure 23. Therefore, in this illustrated embodiment, an extra photolithographic plate does not need to be manufactured.

In a preferred embodiment, an isotropic etchant such as, for example, a fluorine plasma is used to planarize or etch dielectric layer 25. Accordingly, dielectric layer 25 will be undercut to expose a portion of a temporary structure 51. Temporary structure 51 of FIG. 7 is similar to temporary structure 50 of FIG. 3 and has a width 27. In a preferred embodiment, temporary structure 51 comprises spacer 24 and portions 52 and 53 of etch stop layer 22.

Temporary structure 51 is removed to form an opening in which a gate layer can be deposited. The portion of etch stop layer 22 that covers spacer 24 is removed to expose spacer 24 using etch techniques that are similar to those previously described above for etching etch stop layer 12 in FIG. 4. The technique used to remove spacer 24 and to deposit the gate layer in FIG. 7 can be similar to the techniques previously described in FIGS. 4 and 5 to remove temporary structure 50. The opening created by removing temporary structure 51 of FIG. 7 has a width substantially equal to width 27 of temporary structure 51, and the gate electrode formed in the opening will have a gate length substantially equal to width 27 of temporary structure 51.

As known in the art, spacer 24 will be formed along all of the vertical sidewalls of temporary structure 23. If a gate electrode is only desired along certain portions of temporary structure 23, then only certain portions of temporary structure 51 are removed prior to the deposition of the gate layer.

Accordingly, patterned photoresist layer 26 can alternatively be defined such that etching dielectric layer 25 exposes only certain portions of temporary structure 51. Therefore, when removing temporary structure 51, only the exposed portions of temporary structure 51 will be removed.

Figure 8:
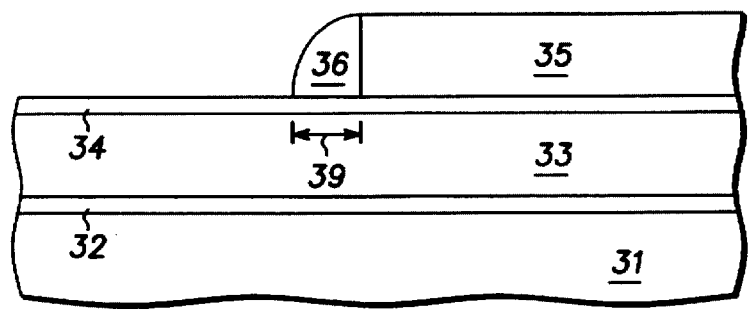
FIGS. 8–13 represent cross-sectional views of another alternative method of defining a line width in accordance with the present invention.

Turning to FIGS. 8–13, cross-sectional views of another alternative method of defining a line width are illustrated in accordance with the present invention. A partial cross-sectional view of a semiconductor component 30 in FIG. 8 depicts a substrate 31, etch stop layers 32 and 34, a dielectric layer 33, a temporary structure 35, and a spacer 36. Semiconductor component 30 of FIG. 8 is similar to semiconductor component 10 of FIG. 1, and etch stop layers 32 and 34 of FIG. 8 are both similar to etch stop layer 12 of FIG. 1. Analogously, substrate 31, temporary structure 35, and spacer 36 of FIG. 8 are preferably similar to semiconductor substrate 11, temporary structure 13, and spacer 14, respectively, of FIG. 1. In a preferred embodiment, dielectric layer 33 is similar in composition to temporary structure 35, and both dielectric layer 33 and temporary structure 35 are different in composition to spacer 36.

As an example of how to fabricate semiconductor component 30 as portrayed in FIG. 8, etch stop layer 32 is first deposited over substrate 31. Then, dielectric layer 33 is provided over etch stop layer 32, and etch stop layer 34 is disposed over dielectric layer 33. Temporary structure 35 is formed over etch stop layer 34, and spacer 36 is formed adjacent to temporary structure 35. Spacer 36 has a width 39.

Figure 9:
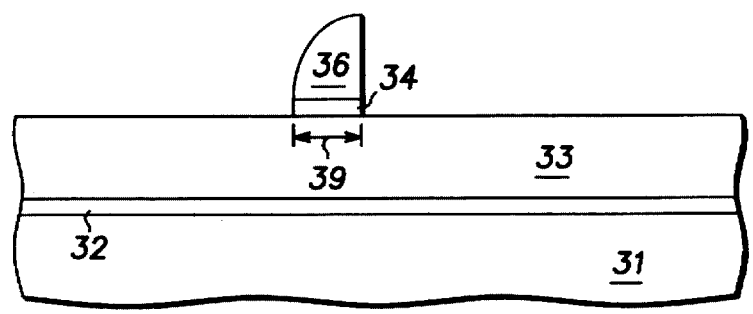

Subsequently, as depicted in FIG. 9, temporary structure 35 is removed, and etch stop layer 34 is etched using spacer 36 as an etch mask. Etch stop layer 34 now has width 39 of spacer 36. In an alternative embodiment, the present invention can omit the use of etch stop layer 34 if temporary structure 35 and spacer 36 can be formed without substantially etching dielectric layer 33 and if spacer 36 can be used as an etch mask for dielectric layer 33 as explained below.

Figure 10:
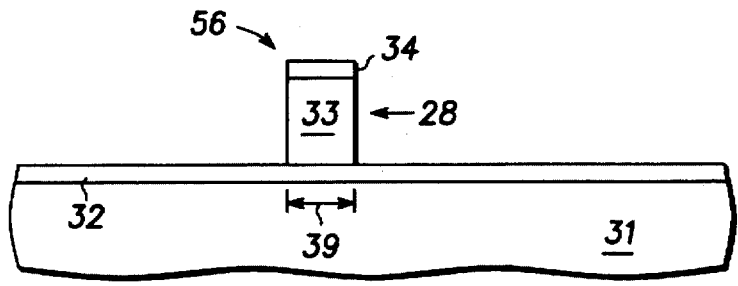
Figure 11:
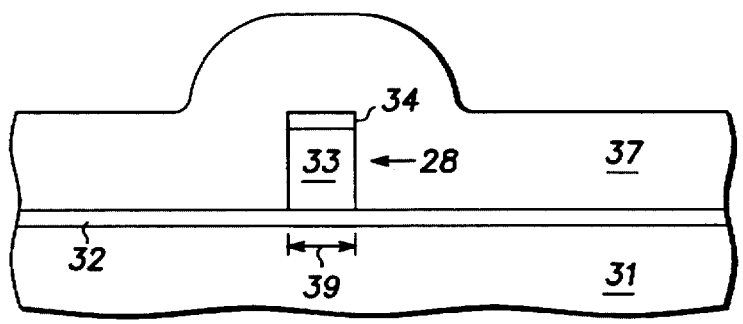

Continuing with FIG. 10, spacer 36 is removed, and etch stop layer 34 is used as an etch mask 56 to etch dielectric layer 33 to create a temporary structure 28. Therefore, in effect, width 39 of spacer 36 has been transferred into temporary structure 28. Although not depicted in FIG. 10, etch mask 56 can be comprised of both spacer 36 and etch stop layer 34 in an alternative embodiment. In either case, spacer 36 is preferably removed prior to the deposition of a dielectric layer 37 as represented in FIG. 11. Dielectric layer 37 can be similar in composition to spacer 36 and is similar in function to dielectric layer 15 of FIG. 2.

As discussed above, temporary structure 28 comprises the etched dielectric layer 33 and the etched etch stop layer 34. However, in an alternative embodiment, etch stop layer 34 can be removed prior to the deposition of dielectric layer 37, in which case temporary structure 28 would be comprised of dielectric layer 33.

Figure 12:
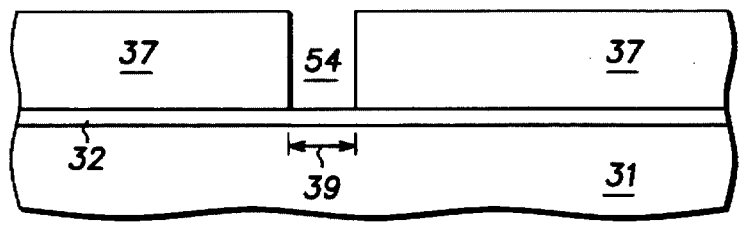
Figure 13:
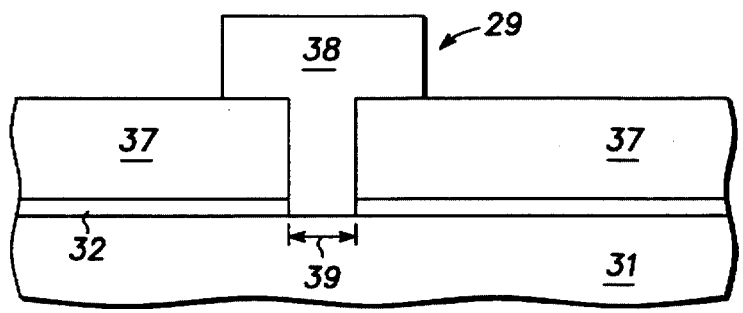

Dielectric layer 37 is planarized to expose a portion of temporary structure 28, which is subsequently removed to create an opening 54 over substrate 31 and in dielectric layer 37 as depicted in FIG. 12. Opening 54 has width 39 of spacer 36 and temporary structure 28. After removal of the exposed portion of etch stop layer 32 in opening 54, an electrically conductive layer 38 is deposited over dielectric layer 37 and fills opening 54 as portrayed in FIG. 13. Electrically conductive layer 38 is similar to gate layer 16 of FIG. 5 and is etched to form gate electrode 29, which has a gate length substantially equal to width 39.

Figure 14:
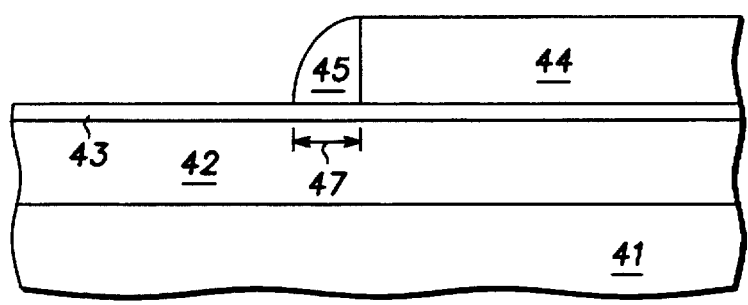
FIGS. 14–16 depict cross-sectional views of yet another alternative method of defining a line width in accordance with the present invention.
Figure 15:
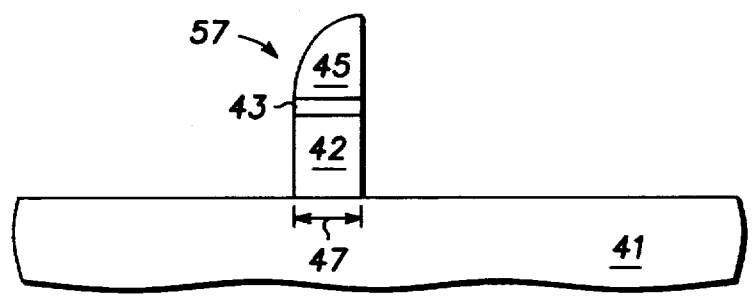
Figure 16:
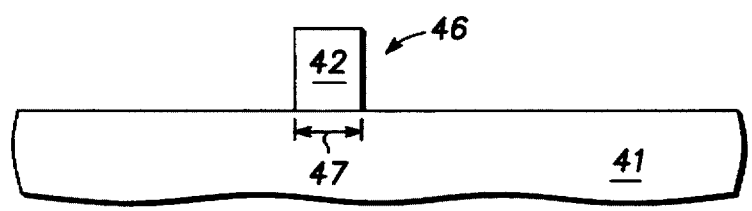

Referring now to the subsequent figures, FIGS. 14–16 depict cross-sectional views of yet another alternative method of defining a line width in accordance with the present invention. In FIG. 14, a partial cross-sectional view of a semiconductor component 40 depicts a substrate 41, which is similar to semiconductor substrate 11 of FIG. 1, an etch stop layer 43, which is similar to etch stop layer 12 of FIG. 1, a temporary structure 44, which is similar to temporary structure 13 of FIG. 1, and a spacer 45, which is similar to spacer 14 of FIG. 1. Electrically conductive layer or gate layer 42 is similar to in composition to both gate layer 16 of FIG. 1 and electrically conductive layer 38 of FIG. 13. Accordingly, semiconductor component 40 is similar to semiconductor component 10 of FIG. 1.

Semiconductor component 40 of FIG. 14 is formed by first depositing gate layer 42 over substrate 41, and then depositing etch stop layer 43 over gate layer 42. Afterwards, temporary structure 44 is formed over etch stop layer 43, and then spacer 45 is formed adjacent to temporary structure 44 and over etch stop layer 43. Spacer 45 has a width 47 as illustrated in FIG. 14.

Next, in FIG. 15, temporary structure 44 is removed, and then etch stop layer 43 is etched using spacer 45 as an etch mask. Subsequently, gate layer 42 is etched while using etch stop layer 43 and spacer 45 as an etch mask 57. Although not depicted in FIG. 15, spacer 45 can be removed after etching etch stop layer 43, and etch mask 57 can consist solely of etch stop layer 43 in an alternative embodiment. However, in either embodiment, width 47 of spacer 45 is used to define a gate length for gate layer 42.

Finally, in FIG. 16, etch stop layer 43 and spacer 45 are removed, and semiconductor component 40 is left with a gate electrode 46 comprised of gate layer 42. Width 47 of spacer 45 defines the gate length for gate electrode 46. Therefore, width 47 is also referred to as gate length 47 or line width 47.

Similar to previous embodiments of the present invention, etch stop layer 43 is not required to form semiconductor component 40. Etch stop layer 43 can be omitted from the illustrated embodiment of FIGS. 14–16 if the formation of temporary structure 44 and spacer 45 does not significantly affect gate layer 42 and if spacer 45 can be used as an etch mask to form gate electrode 46.

In an alternative embodiment, the processes described in FIGS. 14–16 are used to fabricate an insulated gate field effect transistor such as, for example, a MOSFET. In this alternative embodiment, a gate insulator layer (not shown) is provided between gate layer 42 and substrate 41.

While the invention has been particularly shown and described with reference to preferred embodiments, it will be understood by those skilled in the art that changes in form and detail may be made without departing from the spirit and scope of the invention. For instance, the spacers, temporary structures, dielectric layers, and etch stops of the various embodiments in FIGS. 1–16 can be formed of materials other than dielectrics as long as the etch selectivity requirements mentioned previously are satisfied. These other materials include, for example, polysilicon. Moreover, features including, but not limited to, spacers 14, 36, and 45, temporary structures 13, 28, 35, and 44, and etch stop layers 34, and 43 can even be comprised of electrically conducting materials. Furthermore, while the present invention has been described to fabricate gate electrodes, it is understood that a similar method can be used to define line widths of other structures such as interconnect lines, vias, or the like.

Therefore, in accordance with the present invention, it is apparent there has been provided an improved method of defining a line width that overcomes the disadvantages of the prior art, especially when the line width is less than one micron. The present invention eliminates the expensive and complicated procedures of phase shifting, and X-ray, electron beam, and ion beam lithography. As described above, the present invention is manufacturable, cost-efficient, and does not significantly increase the cycle time for manufacturing a semiconductor component.

We claim:

1. A method of defining a line width, the method comprising the steps of:

providing a spacer having a width;

depositing a layer over the spacer; and using the width of the spacer to define the line width by removing the spacer to form a hole in the layer, the hole having the line width.

2. The method according to claim 1, further comprising the step of providing an etch stop layer under the spacer.

3. The method according to claim 2, further including etching the etch stop layer with a first etchant wherein the step of using the width of the spacer to define the line width includes using a different etchant to remove the spacer.

4. The method according to claim 1, further comprising the steps of:

providing a substrate under the spacer; and depositing an electrically conductive layer in the opening.

5. The method according to claim 4, wherein the step of depositing the electrically conductive layer in the opening includes physically contacting the substrate with the electrically conductive layer.

6. A method of making a semiconductor device, the method comprising the steps of:

providing a spacer having a width;

using the width of the spacer to define a line width, wherein the step of using the width of the spacer to define the line width includes using the spacer as an etch mask;

providing a substrate under the spacer; and forming a temporary structure over the substrate, wherein the step of using the width of the spacer to define the line width includes using the width of the spacer to define a line width of the temporary structure.

7. The method according to claim 6, further comprising the steps of:

removing the spacer after the step of forming the temporary structure;

disposing an electrically insulating layer over the substrate and over the temporary structure;

removing a first portion of the electrically insulating layer to expose a second portion of the temporary structure; and removing the temporary structure to form an opening over the substrate, wherein the opening is defined by the line width of the temporary structure.

8. The method according to claim 7, further comprising the step of depositing an electrically conductive layer in the opening, wherein the step of removing the first portion of the electrically insulating layer includes planarizing the electrically insulating layer.

9. The method according to claim 1, wherein the step of providing the spacer includes providing a temporary structure comprised of the spacer.

10. A method of manufacturing a semiconductor device, the method comprising the steps of:

providing a spacer having a width;

using the width of the spacer to define a line width, wherein the step of providing the spacer includes providing a temporary structure comprised of the spacer;

providing a substrate under the spacer;

providing an electrically insulating layer over the temporary structure and the substrate;

removing a first portion of the electrically insulating layer to expose a second portion of the temporary structure; and removing the temporary structure to form an opening over the substrate, the opening defined by the temporary structure.

11. The method according to claim 10, further comprising the step of depositing an electrically conductive layer in the opening, wherein the step of removing the first portion of the electrically insulating layer includes using a chemical-mechanical polish.

12. A method of forming a semiconductor component, the method comprising the steps of:

providing a substrate;

forming a spacer having a width, the spacer located over the substrate;

covering the spacer with a dielectric layer;

exposing a portion of the spacer;

forming an opening over the substrate by etching the spacer; and depositing an electrically conductive layer in the opening.

13. The method according to claim 12, further comprising the step of forming an etch stop layer over the substrate before the step of forming the spacer, wherein the step of forming the opening over the substrate by etching away the spacer includes stopping the etching of the spacer at the etch stop layer.

14. The method according to claim 12, wherein the step of exposing the portion of the spacer includes using a chemical-mechanical polish and wherein the step of forming the opening includes forming the opening having the width of the spacer.

15. The method according to claim 12, wherein the step of exposing the portion of the spacer includes:

forming a patterned photoresist layer over the dielectric layer to expose a portion of the dielectric layer; and etching the portion of the dielectric layer.

16. A method of fabricating a semiconductor component, the method comprising the steps of:

providing a semiconductor substrate;

depositing a first dielectric layer over the semiconductor substrate;

depositing a second dielectric layer over the first dielectric layer;

using the second dielectric layer to form a spacer over the first dielectric layer;

using the first dielectric layer and the spacer to create a temporary structure over the semiconductor substrate;

depositing a third dielectric layer over the temporary structure;

planarizing the third dielectric layer to expose the temporary structure;

forming an opening over the semiconductor substrate by removing the temporary structure; and depositing an electrically conductive layer in the opening.

17. The method according to claim 16, further comprising the steps of:

providing a first etch stop layer between the semiconductor substrate and the first dielectric layer;

providing a second etch stop layer between the first dielectric layer and the second dielectric layer; and removing portions of the first and second etch stop layers prior to the step of depositing the electrically conductive layer in the opening.

18. The method according to claim 16, wherein the step of using the second dielectric layer to form the spacer includes forming the spacer out of the second dielectric layer, wherein the spacer has a width, and wherein the step of using the first dielectric layer and the spacer to create the temporary structure includes creating the temporary structure out of the first dielectric layer, the temporary structure having the width of the spacer.

19. A method of making a semiconductor component, the method comprising the steps of:

providing a semiconductor substrate;

depositing a gate layer over the semiconductor substrate;

depositing a first dielectric layer over the gate layer;

using the first dielectric layer to form a spacer over the gate layer, the spacer having a width; and transferring the width of the spacer into the gate layer to produce a gate electrode having a gate length substantially equal to the width of the spacer.

20. A method of making a semiconductor component, the method comprising the steps of:

providing a semiconductor substrate;

depositing a gate layer over the semiconductor substrate;

depositing a first dielectric layer over the gate layer;

using the first dielectric layer to form a spacer over the gate layer, the spacer having a width;

transferring the width of the spacer into the gate layer to produce a gate electrode having a gate length substantially equal to the width of the spacer, wherein the step of transferring the width of the spacer into the gate layer includes anisotropically etching the gate layer and wherein the step of using the first dielectric layer to form the spacer includes the steps of:

etching the first dielectric layer to form a temporary structure;

depositing a second dielectric layer over the first dielectric layer and over the gate layer;

anisotropically etching the second dielectric layer to form the spacer adjacent to the temporary structure; and removing the temporary structure.

21. The method according to claim 20, further comprising the steps of:

providing an etch stop layer between the gate layer and the spacer; and etching the etch stop layer while using the spacer as a first etch mask.

22. The method according to claim 21, further comprising the step of removing the spacer after the step of etching the etch stop layer and before the step of anisotropically etching the gate layer, wherein the step of anisotropically etching the gate layer includes using the etch stop layer as a second etch mask.

23. The method according to claim 21, wherein the step of anisotropically etching the gate layer includes using the etch stop layer and the spacer as a second etch mask.

* * * * *